United States Patent
Cho et al.

(10) Patent No.: US 8,812,807 B2
(45) Date of Patent: Aug. 19, 2014

(54) NONVOLATILE MEMORY DEVICE AND OPERATING METHOD THEREOF

(75) Inventors: Seung-Duk Cho, Seoul (KR); Hojun Shim, Yongin-si (KR); Kijo Jung, Gwacheon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 162 days.

(21) Appl. No.: 13/601,105

(22) Filed: Aug. 31, 2012

(65) Prior Publication Data

US 2013/0151760 A1   Jun. 13, 2013

(30) Foreign Application Priority Data

Dec. 12, 2011 (KR) .......................... 10-2011-0133035

(51) Int. Cl.
 *G06F 12/16* (2006.01)
 *G06F 3/06* (2006.01)
(52) U.S. Cl.
 CPC ............ *G06F 3/0647* (2013.01); *G06F 3/0659* (2013.01)
 USPC .......................................... 711/165

(58) Field of Classification Search
 None
 See application file for complete search history.

(56) References Cited

U.S. PATENT DOCUMENTS

| | | | |
|---|---|---|---|
| 7,836,243 B2 | 11/2010 | Ishimoto et al. | |
| 2007/0033581 A1 | 2/2007 | Tomlin et al. | |
| 2007/0186682 A1 | 8/2007 | Duffill et al. | |
| 2009/0049364 A1 | 2/2009 | Jo et al. | |
| 2009/0172386 A1 | 7/2009 | Tomlin et al. | |
| 2010/0017561 A1 | 1/2010 | Yang et al. | |

FOREIGN PATENT DOCUMENTS

| | | | |
|---|---|---|---|
| KR | 10-2007-0026804 A | 3/2007 | |
| KR | 10-2008-0038370 A | 5/2008 | |
| KR | 10-2009-0017844 A | 2/2009 | |

*Primary Examiner* — Duc Doan
(74) *Attorney, Agent, or Firm* — Harness, Dickey & Pierce, P.L.C.

(57) ABSTRACT

Disclosed is a memory system which includes a nonvolatile memory device configured to store data information; and a memory controller configured to control the nonvolatile memory device. The memory controller provides the nonvolatile memory device with a program command sequence including program speed information according to an urgency level of an internally requested program operation.

20 Claims, 14 Drawing Sheets

NONVOLATILE MEMORY DEVICE AND OPERATING METHOD THEREOF

CROSS-REFERENCE TO RELATED APPLICATIONS

A claim for priority under 35 U.S.C §119 is made to Korean Patent Application No. 10-2011-0133035 filed Dec. 12, 2011, the entirety of which is incorporated by reference herein.

BACKGROUND

The inventive concepts described herein relate to a nonvolatile memory device, and more particularly, relate to a memory system including a nonvolatile memory device.

Semiconductor memory devices are a microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logicsystems.

Semiconductor memory devices may include volatile memory devices, such as random access memory (RAM) devices, and nonvolatile memory devices. In RAM devices, data is stored by either establishing the logic state of a bistable flip-flop such as in a static random access memory (SRAM), or by charging a capacitor in a dynamic random access memory (DRAM). In volatile memory devices, such as SRAM and DRAM devices, data remains stored and may be read as long as the power is applied, but data is lost when the power is turned off.

Nonvolatile memory devices, such as Mask Read-Only Memory (MROM), Programmable Read-Only Memory (PROM), Erasable Programmable Read-Only Memory (EPROM), and Electrically Erasable Programmable Read-Only Memory (EEPROM) devices are capable of storing the data, even with the power turned off. The non-volatile memory data storage state may be permanent or reprogrammable, depending upon the fabrication technology used. Nonvolatile semiconductor memories are used to store program and microcode storage in a wide variety of applications in the computer, avionics, telecommunications, and consumer electronics industries.

A combination of single-chip volatile as well as nonvolatile memory storage modes is also available in devices such as nonvolatile SRAM (nvRAM) for use in systems that require fast, reprogrammable nonvolatile memory. In addition, dozens of special memory architectures have evolved which contain some additional logic circuitry to optimize their performance for application-specific tasks.

Mask Read-Only Memory (MROM), Programmable Read-Only Memory (PROM) and Erasable Programmable Read-Only Memory (EPROM) nonvolatile memory devices are not free to erase and write by itself, making updating the contents of the memory relatively complicated. On the other hand, Electrically Erasable Programmable Read-Only Memory (EEPROM) nonvolatile memory devices are electrically erasable and writable, and may, thus, be readily applied to auxiliary memories or system programming memories that require continuous update.

SUMMARY

Example embodiments of the inventive concepts provide a memory system comprising a nonvolatile memory device configured to store data information; and a memory controller configured to control the nonvolatile memory device by providing the nonvolatile memory device with a program command sequence including program speed information according to an urgency level of an internally requested program operation.

In example embodiments, the internally requested program operation includes one of a background operation of the memory controller, an operation associated with sudden power-off, and a garbage collection operation.

In example embodiments, a program time of the background operation is longer than a program time of an externally requested program operation.

In example embodiments, a program time of the operation associated with the sudden power-off is shorter than a program time of an externally requested program operation.

In example embodiments, the program command sequence includes a first command, an address, and a second command, a value of the second command is decided according to whether a program operation is he exernally requested program operation or the internally requested program operation.

In example embodiments, data programmed via the operation associated with the sudden power-off is metadata.

In example embodiments, data programmed via the operation associated with the sudden power-off is reprogrammed based on the externally requested program operation.

In example embodiments, the nonvolatile memory device comprises a voltage generator configured to generate a program voltage; and control logic configured to decide a start level of the program voltage or an increment of the program voltage based on program speed information included in the program command sequence.

In example embodiments, the memory controller and the nonvolatile memory device together form part of one of a memory card and a solid state drive.

Example embodiments of the inventive concepts also provide an operating method of a memory system which includes a nonvolatile memory device and a memory controller. The operating method comprises judging whether a program operation is an internally requested program operation requested within the memory controller or an externally requested program operation requested from a device external to the memory controller; and providing the nonvolatile memory device with a program command sequence including information of a program speed that varies according to an urgency level of the requested program operation, based on the judgment result.

In example embodiments, the internally requested program operation includes one of a background operation of the memory controller, an operation associated with sudden power-off, and a garbage collection operation.

In example embodiments, a program time of the background operation is longer than a program time of the externally requested program operation.

In example embodiments, a program time of the operation associated with the sudden power-off is shorter than a program time of the externally requested program operation.

In example embodiments, the program command sequence includes a first command, an address, and a second command, and a value of the second command is decided according to whether the program operation is the exernally requested program operation or the internally requested program operation.

In example embodiments, the program speed is varied by controlling a start level or an increment of a program voltage based on program speed information included in the program command sequence.

Example embodiments also provide a memory system including a nonvolatile memory device configured to program write data into memory cells at a program speed; and a memory controller configured to transmit a program command sequence to the nonvolatile memory device, the program command sequence varying the program speed according to whether a program operation is an internally requested program operation requested within the memory controller or an external requested program operation requested from a device external to the memory controller.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
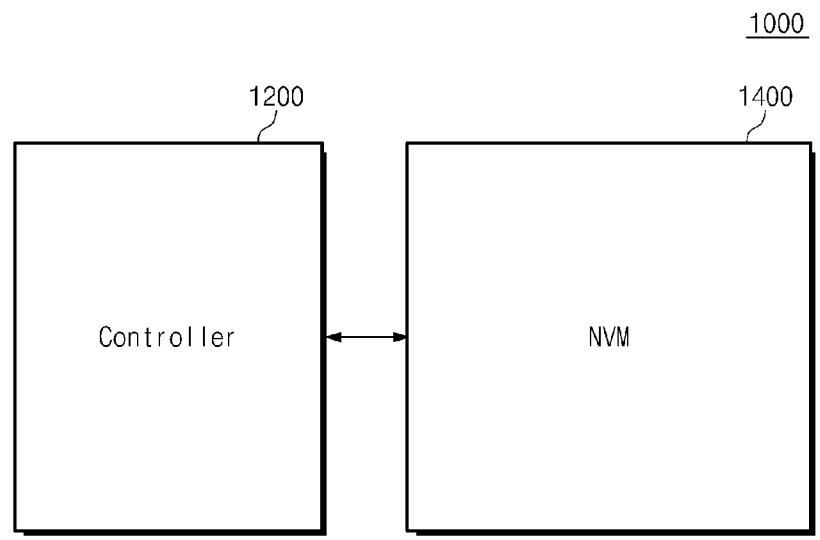
FIG. 1 is a block diagram schematically illustrating a memory system according to an embodiment of the inventive concepts.

The inventive concepts are described more fully hereinafter with reference to the accompanying drawings, in which embodiments of the inventive concepts are shown. These inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system according to an embodiment of the inventive concepts.

Referring to FIG. 1, a memory system 1000 according to an embodiment of the inventive concepts may include a memory controller 1200 and a nonvolatile memory device 1400. The memory controller 1200 may be configured to control the nonvolatile memory device 1400 according to an external request (e.g., a write request, a read request, etc.) of an external device (e.g., a host). The memory controller 1200 may be configured to control the nonvolatile memory device 1400 according to an internal request (e.g., an operation associated with sudden power-off, background operations such as merge, garbage collection, etc.) without an external request. The nonvolatile memory device 1400 may operate responsive to the control of the memory controller 1200, and may be used as a type of storage medium which stores data information. The storage medium may be formed of one or more memory chips. The nonvolatile memory device 1400 may communicate with the memory controller 1200 via one or more channels. The nonvolatile memory device 1400 may include a NAND flash memory device, for example.

The memory controller 1200 may control the nonvolatile memory device 1400 such that a program operation is performed according to one of different program speeds. In example embodiments, the memory controller 1200 may provide a program command including program speed information to the nonvolatile memory device 1400 at a program operation. Herein, the program speed information may be included within the program command using various manners. For example, a program operation of the nonvolatile memory device 1400 may be performed according to a program command sequence from the memory controller 1200, that is, a set of a first command, an address, program data, and a second command. The first command (e.g., 80h) may be a command informing an input of program data, that is, a data input command. The second command may be a program confirm command. If the second command as the program confirm command is received, the nonvolatile memory device 1400 may perform a program operation during a given program time tPGM.

In example embodiments, the second command may include program speed information. A program operation may be a normal program operation (or, a default program operation), a fast program operation, or a slow program operation. The normal program operation may indicate a program operation executed in a program speed tPGM1 that is defined at the product specification. The fast program operation may indicate a program operation executed in a program speed tPGM2 higher than the program speed tPGM1. The slow program operation may indicate a program operation executed in a program speed tPGM2 slower than the program speed tPGM1. Thus, a program time taken to perform a program operation may be varied according to the second command transferred to the nonvolatile memory device 1400 from the memory controller 1200.

A program command sequence for the normal program operation is generated by the memory controller 1200 according to a write request of the external device (e.g., a host), while program command sequences for the fast and slow program operations may be generated by the memory controller according to an internal request without an external request. Herein, the internal request may include a background operation (e.g., garbage collection, periodical updating of metadata, etc.), an operation associated with sudden power-off (e.g., dumping of metadata to the nonvolatile memory device 1400 from the memory controller 1200), and the like. Since executed at an idle time, the background operation may not need as much program time as the normal program operation. On the other hand, an operation associated with the sudden power-off must be performed within a rapid time. With the inventive concepts, it is possible to variably control a program time based on an urgency level of an operation to be executed.

Figure 2:
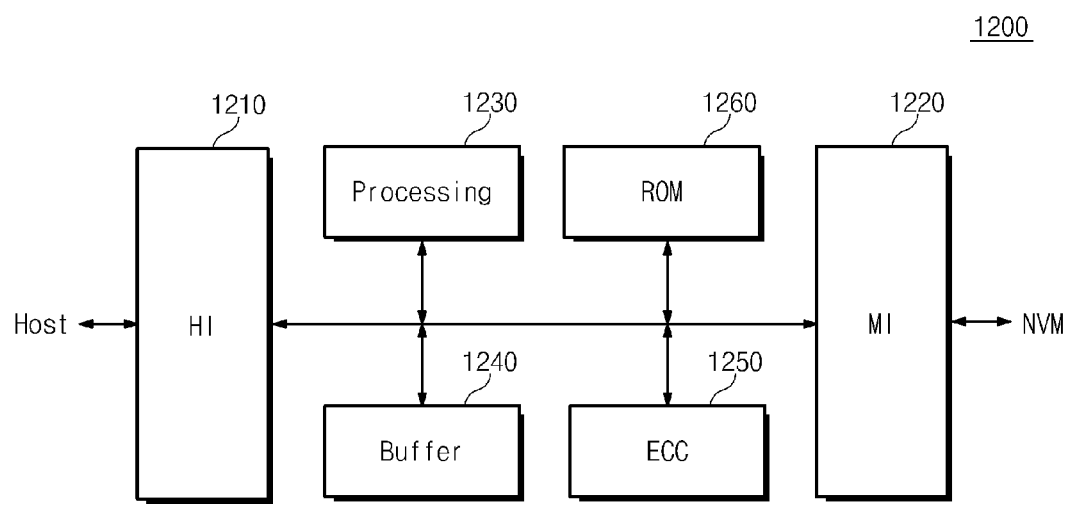
FIG. 2 is a block diagram schematically illustrating a memory controller in FIG. 1.

FIG. 2 is a block diagram schematically illustrating a memory controller in FIG. 1. Referring to FIG. 2, a controller 1200 may include a host interface 1210 as a first interface, a memory interface 1220 as a second interface, a processing unit 1230 such as CPU, a buffer memory 1240, an error detecting and correcting circuit (ECC) 1250, and a ROM 1260.

The host interface 1210 may be configured to interface with an external device (for example, a host), and the memory interface 1220 may be configured to interface with a nonvolatile memory device 1400 illustrated in FIG. 1. The processing unit 1230, that is, a CPU may be configured to control an overall operation of the controller 1200. The processing unit 1230 may be configured to operate firmware such as Flash Translation Layer (FTL), for example. The buffer memory 1240 may be used to temporarily store data transferred from an external device via the host interface 1210 or data transferred from the nonvolatile memory device 1400 via the memory interface 1220. The buffer memory 1240 may be used to store information (referred to as mapping/metadata information) needed to control the nonvolatile memory device 1400. The ECC 1250 may be configured to encode data to be stored in the nonvolatile memory device 1400 and to decode data read out from the nonvolatile memory device 1400. The ROM 1260 may be used to store firmware such as the FLT. In other example embodiments, the memory controller 1200 can be configured not to include the ROM 1260. In this case, firmware to be stored in the ROM 1260 may be stored in the nonvolatile memory device 1400 being controlled by the memory controller 1200, and may be loaded onto the memory controller 1200 from the nonvolatile memory device 1400 at power-up.

For the inventive concepts, the memory controller 1200 may control the nonvolatile memory device 1400 such that a program time is varied according to an urgency level of a program operation. A program operation having a default program time may be performed according to an external request, while a program operation having a program time longer or shorter than the default program time may be executed according to an internal request without an external request. This will be more fully described later.

In example embodiments, the host interface 1210 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCP-Peripheral bus standards may include Apple Desktop Bus, HIL, MIDI, Multibus, RS-232, DMX512-A, EIA/RS-422, IEEE-1284, UNI/O, 1-Wire, 12C, SPI, EIA/RS-485, USB, Camera Link, External PCIe, Light Peak, Multidrop Bus, etc.

Although not illustrated in figures, the memory controller 1200 may further include a randomizer/de-randomizer which is configured to randomize data to be stored in the nonvolatile memory device 1400 and to de-randomize data read from the nonvolatile memory device 1400. An example of the randomizer/de-randomizer is disclosed in U.S. Patent Publication No. 2010/0088574, the entirety of which is incorporated by reference herein.

Figure 3:
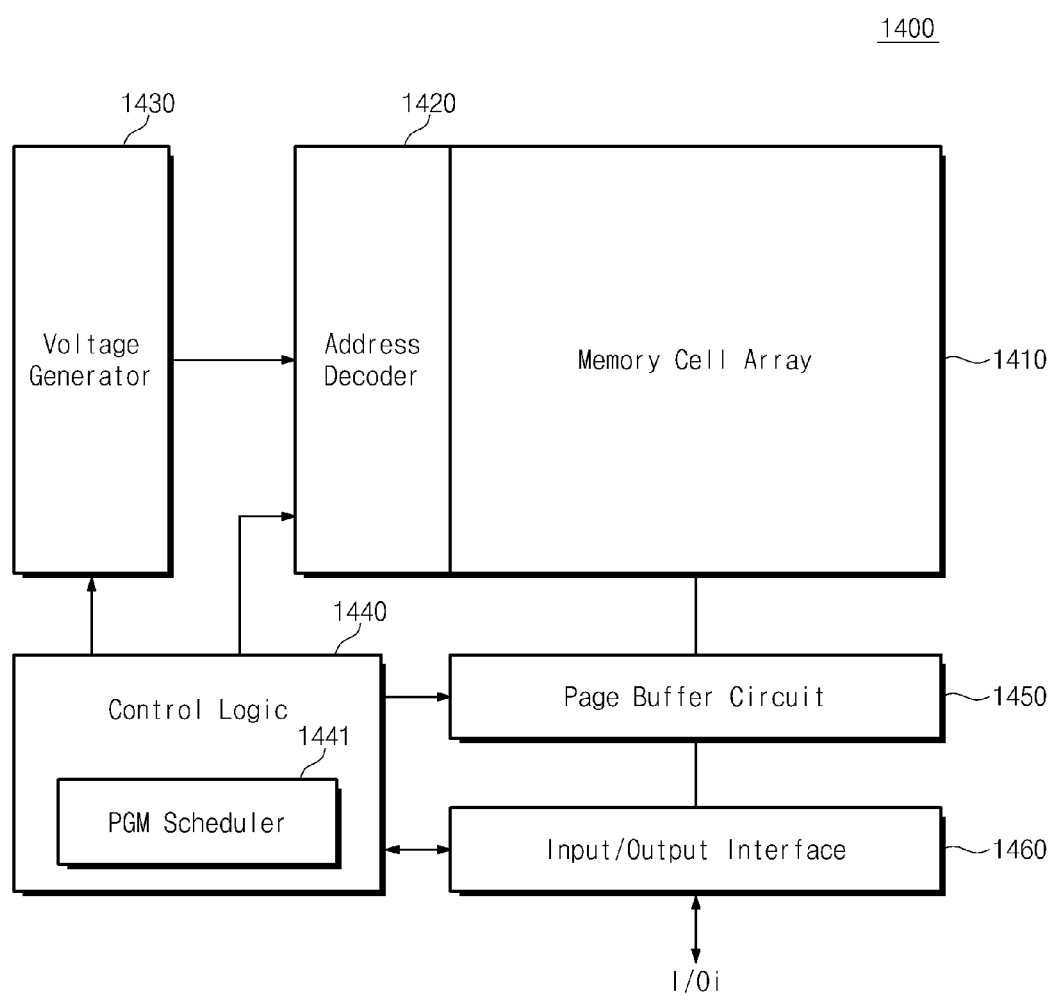
FIG. 3 is a block diagram schematically illustrating a nonvolatile memory device in FIG. 1.

FIG. 3 is a block diagram schematically illustrating a nonvolatile memory device in FIG. 1.

A nonvolatile memory device 1400 may be a NAND flash memory device, for example. However, it is well understood that the nonvolatile memory device 1400 is not limited to the NAND flash memory device. For example, the inventive concepts may be applied to a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like. Further, the nonvolatile memory device 1400 can be implemented to have a three-dimensional array structure. A nonvolatile memory device with the three-dimensional array structure may be referred to as a vertical NAND flash memory device. The inventive concepts may be applied to a Charge Trap Flash (CTF) memory device including a charge storage layer formed of an insulation film as well as a flash memory device including a charge storage layer formed of a conductive floating gate.

Referring to FIG. 3, the nonvolatile memory device 1400 may include a memory cell array 1410, an address decoder 1420, a voltage generator 1430, control logic 1440, a page buffer circuit 1450, and an input/output interface 1460.

The memory cell array 1410 may include memory cells arranged at intersections of rows (e.g., word lines) and columns (e.g., bit lines). Each memory cell may store 1-bit data or multi-bit data (M being an integer of 2 or more). The address decoder 1420 may be controlled by the control logic 1440, and may perform selecting and driving operations on rows (e.g., word lines, a string selection line(s), a ground selection line(s), a common source line, etc.) of the memory cell array 1410. The voltage generator 1430 may be controlled by the control logic 1440, and may generate voltages required for each operation such as a high voltage, a program voltage, a read voltage, a verification voltage, an erase voltage, a pass voltage, a bulk voltage, and the like. Voltages generated by the voltage generator 1430 may be provided to the memory cell array 1410 via the address decoder 1420. The control logic 1440 may be configured to control an overall operation of the nonvolatile memory device 1400.

The page buffer circuit 1450 may be controlled by the control logic 1440, and may be configured to read data from the memory cell array 1410 and to drive columns (e.g., bit lines) of the memory cell array 1410 according to program data. The page buffer circuit 1450 may include page buffers respectively corresponding to bit lines or bit line pairs. Each of the page buffers may include a plurality of latches. The input/output interface 1460 may be controlled by the control logic 1440, and may interface with an external device (e.g., the memory controller 1200 in FIG. 1). Although not illustrated in FIG. 3, the input/output interface 1460 may include a column decoder configured to select page buffers of the page buffer circuit 1450 by a predetermined unit, an input buffer receiving data, an output buffer outputting data, and the like.

The control logic 1440 may include a program scheduler 1441. The program scheduler 1441 may control a program operation of the nonvolatile memory device 1400. In particular, the program scheduler 1441 may variably control a program speed according to a program command sequence provided from a memory controller 1200. The program speed may be variably controlled using various methods. For example, a program speed may be varied by controlling a start level of a program voltage. Alternatively, in case that an incremental step pulse programming manner is used, a program speed may be varied by controlling an increment of a program voltage. It is well understood that variation in a program speed is not limited thereto. A start level or an increment of a program voltage may be varied by controlling the voltage generator 1430. The program scheduler 1441 may variably decide a program speed according to a program command sequence, in particular, a second command (or, a program confirm command) including program speed information.

With the inventive concepts, the reliability/endurance may be improved by deciding a program time according to an urgency level of a program operation.

Figure 4:
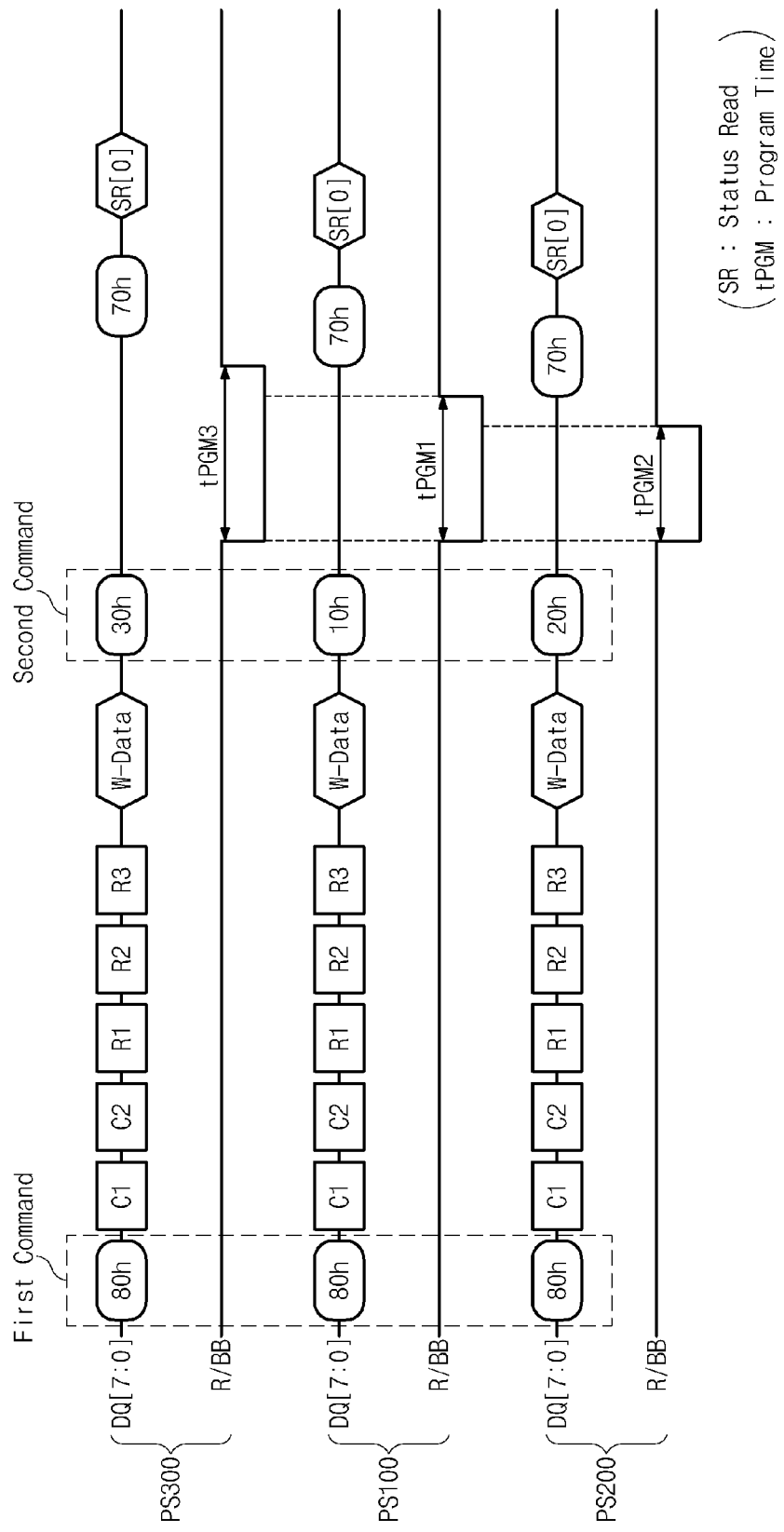
FIG. 4 is a diagram illustrating various program command sequences according to an embodiment of the inventive concepts.

FIG. 4 is a diagram illustrating various program command sequences according to an embodiment of the inventive concepts.

Referring to FIG. 4, at a program operation, a program command sequence may be provided to a nonvolatile memory device 1400 from a memory controller 1200. As described above, a program operation of the nonvolatile memory device 1400 may be executed according to an external request or an internal request of the memory controller 1200. When a write operation is requested from an external device, the memory controller 1200 may transfer a program command sequence PS100, during which the nonvolatile memory device 1400 is sequentially provided with a first command 80$h$, an address C1, C2, R1, R2, R3, write data W-Data, and a second command 10$h$ according to the program command sequence PS100. During a transfer of the program command sequence PS100, a control signal R/BB may maintain a high level. If the second command 10$h$ including program speed information is received, the control signal R/BB may goes to a low level. During a program time tPGM1, that is, a period of time when the control signal R/BB is maintained at a low level, a program operation may be executed. When a value of the second command is '10$h$', the program operation may be performed during a default program time tPGM1. After the program time tPGM1 elapses, the control signal R/BB may go to a high level. In response to a low-to-high transition of the control signal R/BB, the memory controller 1200 may transfer a status read command 70$h$ to the nonvolatile memory device 1400. The nonvolatile memory device 1400 may output status read data SR[0] indicating whether a program operation is passed or failed.

A background operation such as garbage collection may be performed during an idle time of a memory system 1000. The background operation may be requested by the memory controller 1200, not an external device. When a program operation associated with the background operation is requested, the memory controller 1200 may transfer a program command sequence PS300, during which the nonvolatile memory device 1400 is sequentially provided with a first command 80$h$, an address, write W-Data data, and a second command 30$h$ according to the program command sequence PS300. During a transfer of the program command sequence PS300, the control signal R/BB may maintain a high level. If the second command 30$h$ including program speed information is received, the control signal R/BB may goes to a low level. During a program time tPGM3, that is, a period of time when the control signal R/BB is maintained at a low level, a program operation may be executed. When a value of the second command is '30$h$', the program operation may be performed during a program time tPGM3 which is longer than the default program time tPGM1. A program time may be controlled by a program scheduler 1441 as described above. For example, a start level and an increment of a program voltage generated by a voltage generator 1430 may be decided by the program scheduler 1441. However, it is well understood that adjustment of the program time is not limited thereto.

After the program time tPGM3 elpses, the control signal R/BB may go to a high level. In response to a low-to-high transition of the control signal R/BB, the memory controller 1200 may transfer a status read command 70h to the nonvolatile memory device 1400. The nonvolatile memory device 1400 may output status read data SR[0] indicating whether a program operation is passed or failed.

An operation associated with sudden power-off may be requested within the memory controller 1200 not by the external device. When a program operation associated with the sudden power-off (e.g., a program operation associated with metadata) is requested, the memory controller 1200 may transfer a program command sequence PS200, during which the nonvolatile memory device 1400 is sequentially provided with a first command 80h, an address, write data W-Data, and a second command 20h according to the program command sequence PS200. During a transfer of the program command sequence PS200, the control signal R/BB may maintain a high level. If the second command 20h including program speed information is received, the control signal R/BB may goes to a low level. During a program time tPGM2, that is, a period of time when the control signal R/BB is maintained at a low level, a program operation may be executed. When a value of the second command is '20h', the program operation may be performed during a program time tPGM2 which is shorter than the default program time tPGM1. A program time may be controlled by the program scheduler 1441 as described above. For example, a start level and an increment of a program voltage generated by the voltage generator 1430 may be decided by the program scheduler 1441. However, it is well understood that adjustment of the program time is not limited thereto.

After the program time tPGM2 elapses, the control signal R/BB may go to a high level. In response to a low-to-high transition of the control signal R/BB, the memory controller 1200 may transfer a status read command 70h to the nonvolatile memory device 1400. The nonvolatile memory device 1400 may output status read data SR[0] indicating whether a program operation is passed or failed.

With the above description, program command sequences may be summed up as illustrated by the following table.

| Function | 1st command | Address cycle | 2nd command |
|---|---|---|---|
| Normal page program | 80 h | 5 | 10 h |
| Fast page program | 80 h | 5 | 20 h |
| Slow page program | 80 h | 5 | 30 h |

A program command sequence transferred to the nonvolatile memory device 1400 from the memory controller 1200, that is, a second command may be distinguished to indicate program speed information. As illustrated in FIG. 4, a program time may be varied according to a value of the second command. Herein, note that a difference between a maximum value and a minimum value of a program time defined at the product specification is included within one program time. That is, each of different program times tPGM1, tPGM2, and tPGM3 may have a maximum value and a minimum value As described above, compared with a default program operation, a fast program operation may be accomplished by setting a start level of a program voltage to be high. The number of program loops may be reduced by by setting a start level of a program voltage to be high. Thus, a program time may be shortened. In this case, overprogramming causing an increase in a Bit Error Rate (BER) may result. However, data programmed via the fast program operation may be read as normal data by managing the number of erroneous bits within an ECC capacity. Later, it is possible to perform a normal program operation using read refresh. A read count policy of the fast program operation may be decided to be different from the normal program operation.

A nonvolatile memory device 1400 of the inventive concepts may be advantageous to improve the productivity. For example, a program time of a nonvolatile memory device may vary according to a product to which the nonvolatile memory device is applied. That is, although a nonvolatile memory device is fabricated using the same process, line-up may be classified according to products to which different program times are applied. However, it is possible for nonvolatile memory devices to be provided at the same process condition and having different program times, by using additional program command sequences. As a result, the productivity may be improved.

Figure 5:
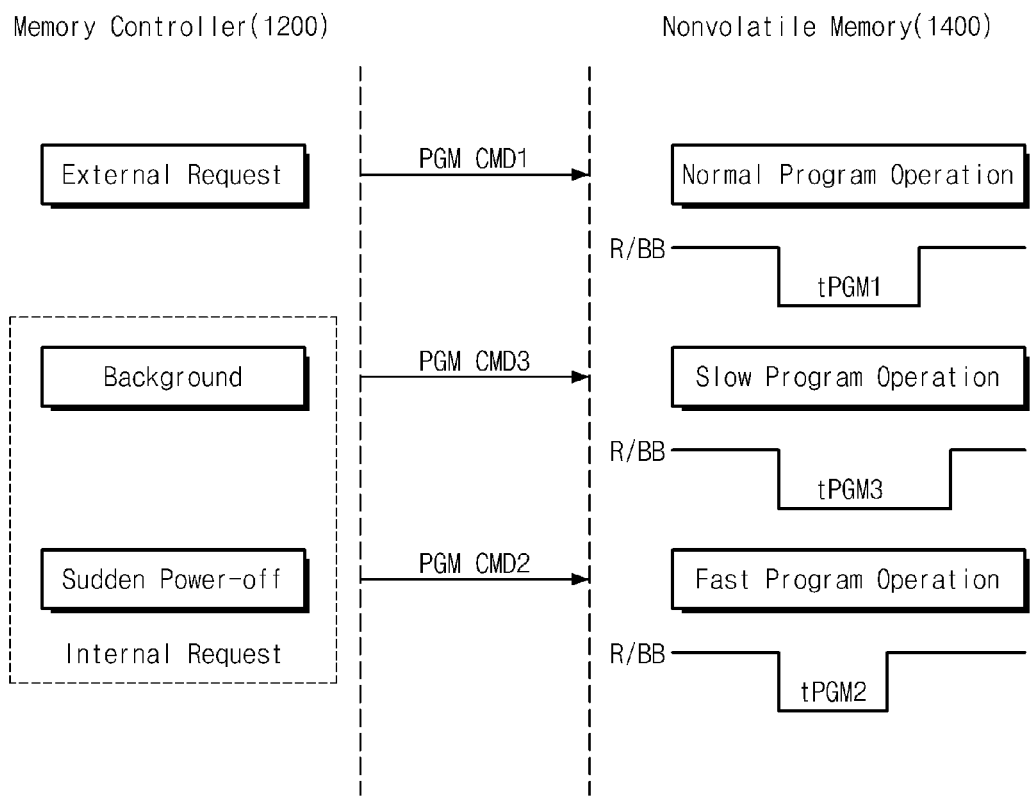
FIG. 5 is a diagram describing an operating method of a memory system according to an embodiment of the inventive concepts.

FIG. 5 is a diagram describing an operating method of a memory system according to an embodiment of the inventive concepts.

Referring to FIG. 5, a memory controller 1200 may judge whether a program operation is requested from an external device or internally. If a program operation is judged to be requested from an external device, the memory controller 1200 may provide a nonvolatile memory device 1400 with a first command, an address, write data, and a second command according to a first program command sequence. Herein, the second command may include program speed information, and the nonvolatile memory device 1400 may decide a program speed according to program speed information of the second command. That is, the nonvolatile memory device 1400 may execute a program operation during a default program time tPGM1.

If a program operation is judged to be requested internally, the memory controller 1200 may judge an urgency level of a requested program operation. If the requested program operation is urgent, the memory controller 1200 may provide the nonvolatile memory device 1400 with a first command, an address, write data, and a second command according to a second program command sequence. Herein, the second command may include program speed information, and the nonvolatile memory device 1400 may decide a program speed according to program speed information of the second command. That is, the nonvolatile memory device 1400 may execute a program operation during a program time tPGM2 shorter than the default program time tPGM1.

If the requested program operation is not urgent, the memory controller 1200 may provide the nonvolatile memory device 1400 with a first command, an address, write data, and a second command according to a second program command sequence. Herein, the second command may include program speed information, and the nonvolatile memory device 1400 may decide a program speed according to program speed information of the second command. That is, the nonvolatile memory device 1400 may execute a program operation during a program time tPGM3 longer than the default program time tPGM1.

Figure 6:
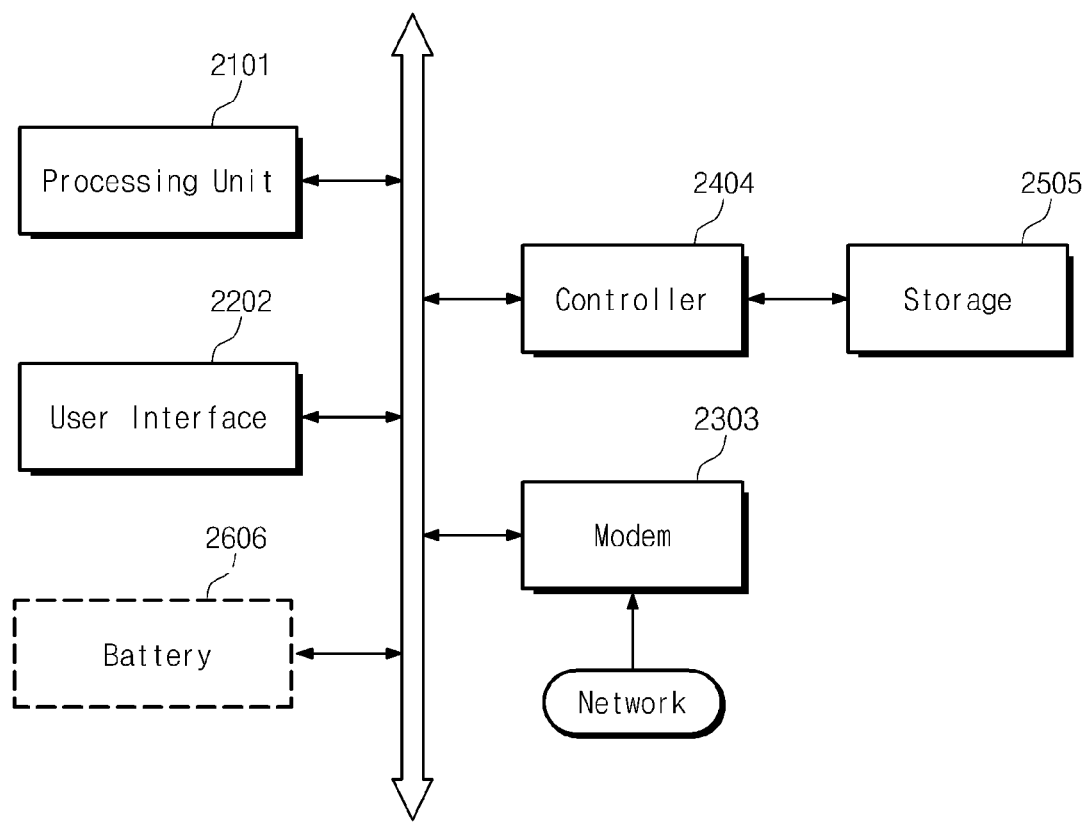
FIG. 6 is a block diagram showing a computing system according to an embodiment of the inventive concepts.

FIG. 6 is a block diagram showing a computing system according to an embodiment of the inventive concepts.

A computing system may include a processing unit 2101, a user interface 2202, a modem 2303 such as a baseband chipset, a memory controller 2404, and a nonvolatile memory device 2505 as a storage medium. The memory controller 2404 and the nonvolatile memory device 2505 may be substantially equal to that illustrated in FIG. 1. That is, the memory controller 2404 may control the nonvolatile memory device 2505 such that a program time is varied according to an urgency level of a program operation. This may be accomplished using program command sequences including program speed information. N-bit data (N being 1 or more integer) processed/to be processed by the processing unit 2101 may be stored in the nonvolatile memory device 2505 through the memory controller 2404. In the event that the computing system is a mobile device, a battery 2606 may be further included in the computing system to supply an operating voltage thereto. Although not illustrated in FIG. 9, the computing system may further comprise an application chipset, a camera image processor (CIS), a mobile DRAM, and the like.

Figure 7:
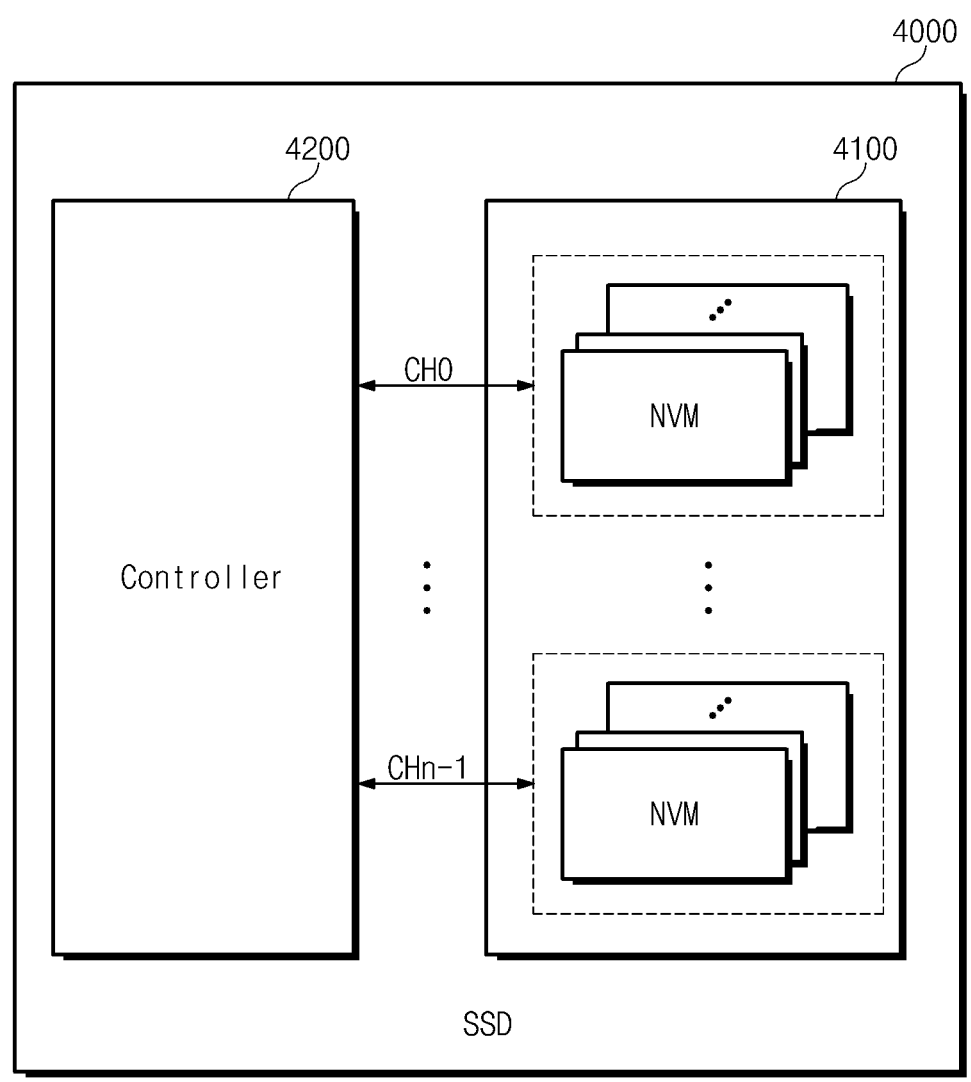
FIG. 7 is a block diagram showing a solid state drive according to an embodiment of the inventive concepts.

FIG. 7 is a block diagram showing a solid state drive according to an embodiment of the inventive concepts.

Referring to FIG. 7, a solid state drive (SSD) 4000 may comprise storage medium 4100 and a controller 4200. The storage medium 4100 may be connected with the controller 4200 via a plurality of channels, each of which is connected in common to a plurality of nonvolatile memories NVM. The controller 4200 and each nonvolatile memory NVM may be configured the same as illustrated in FIG. 1. That is, the memory controller 4200 may control each nonvolatile memory device NVM such that a program time is varied according to an urgency level of a program operation. This may be accomplished using program command sequences including program speed information.

Figure 8:
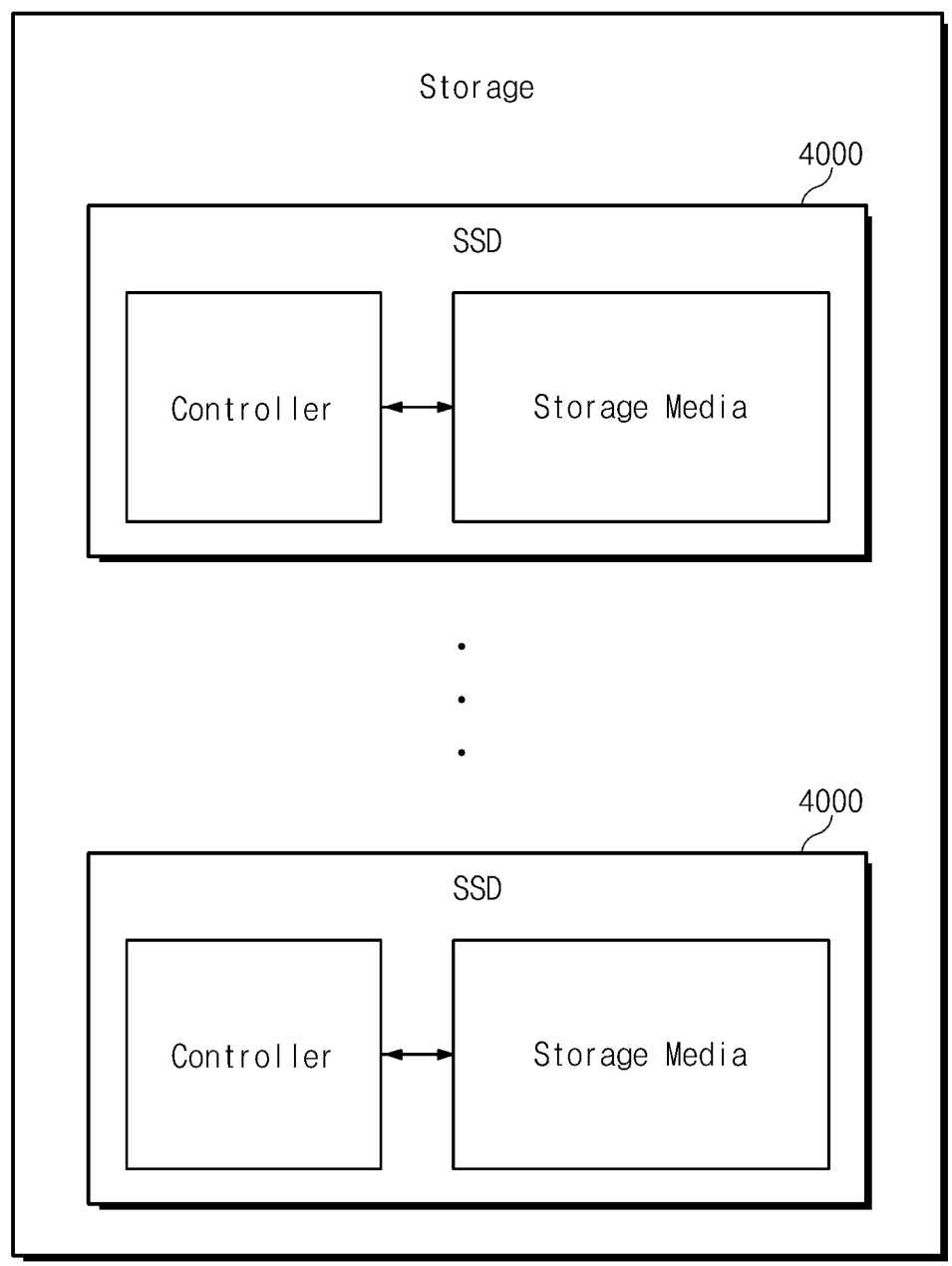
FIG. 8 is a block diagram showing a storage using a solid state drive in FIG. 7.
Figure 9:
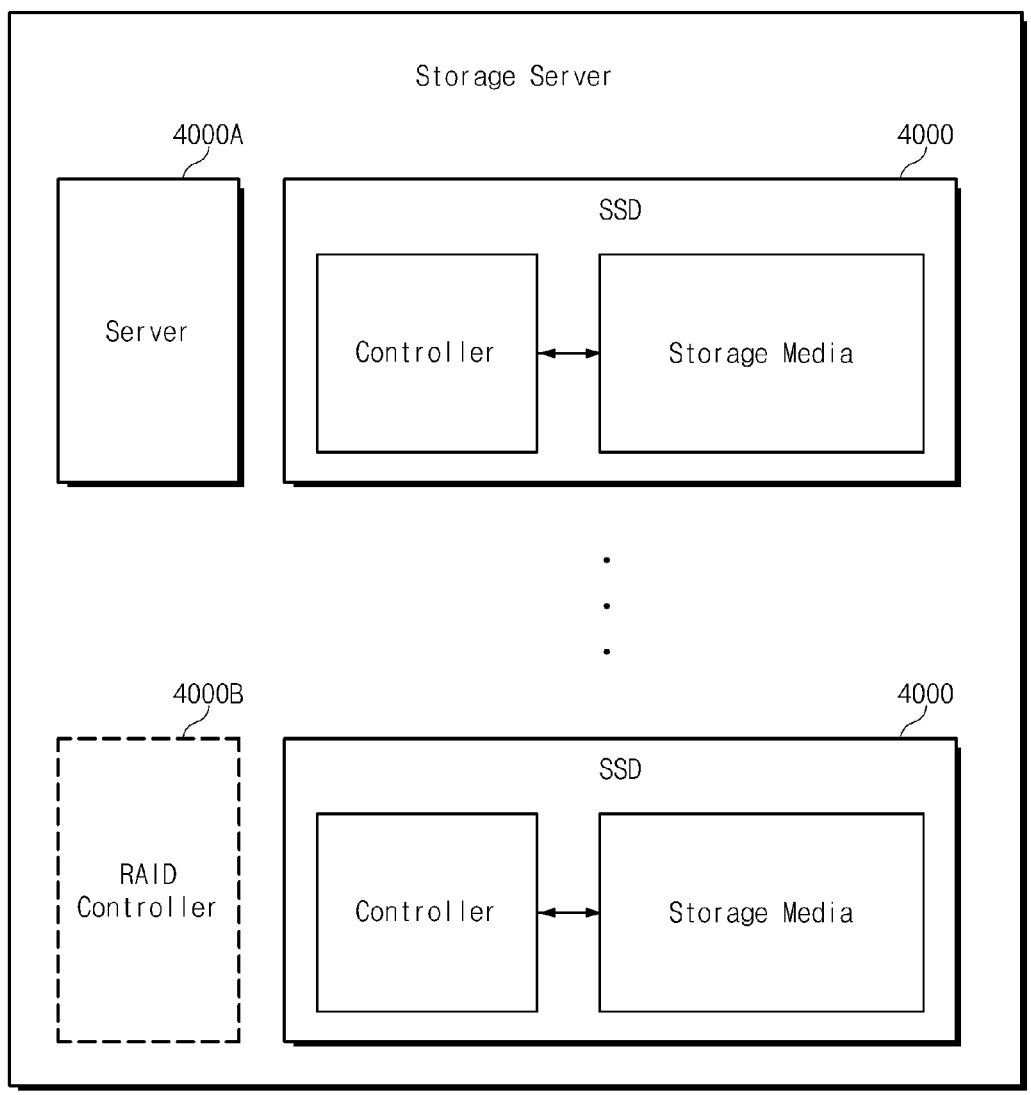
FIG. 9 is a block diagram showing a storage server using a solid state drive in FIG. 7.

FIG. 8 is a block diagram showing a storage using a solid state drive in FIG. 7, and FIG. 9 is a block diagram showing a storage server using a solid state drive in FIG. 7.

An SSD 4000 according to an embodiment of the inventive concepts may be used to form the storage. As illustrated in FIG. 8, the storage includes a plurality of solid state drives 4000 which are configured the same as described in FIG. 7. An SSD 4000 according to an embodiment of the inventive concepts is used to configure a storage sever. As illustrated in FIG. 9, a storage server includes a plurality of solid state drives 4000, which are configured the same as described in FIG. 7, and a server 4000A. Further, it is well comprehended that a well-known RAID controller 4000B is provided in the storage server.

Figure 10:
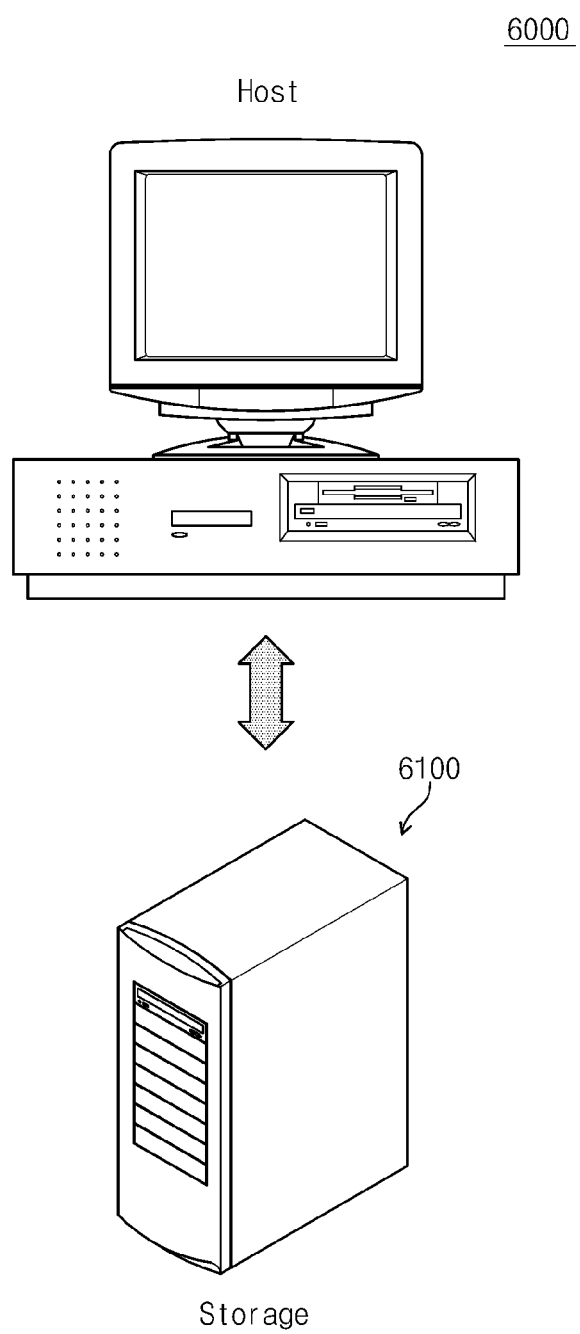
FIGS. 10 to 12 are diagrams schematically illustrating systems to which a data storage device according to an embodiment of the inventive concepts is applied.
Figure 11:
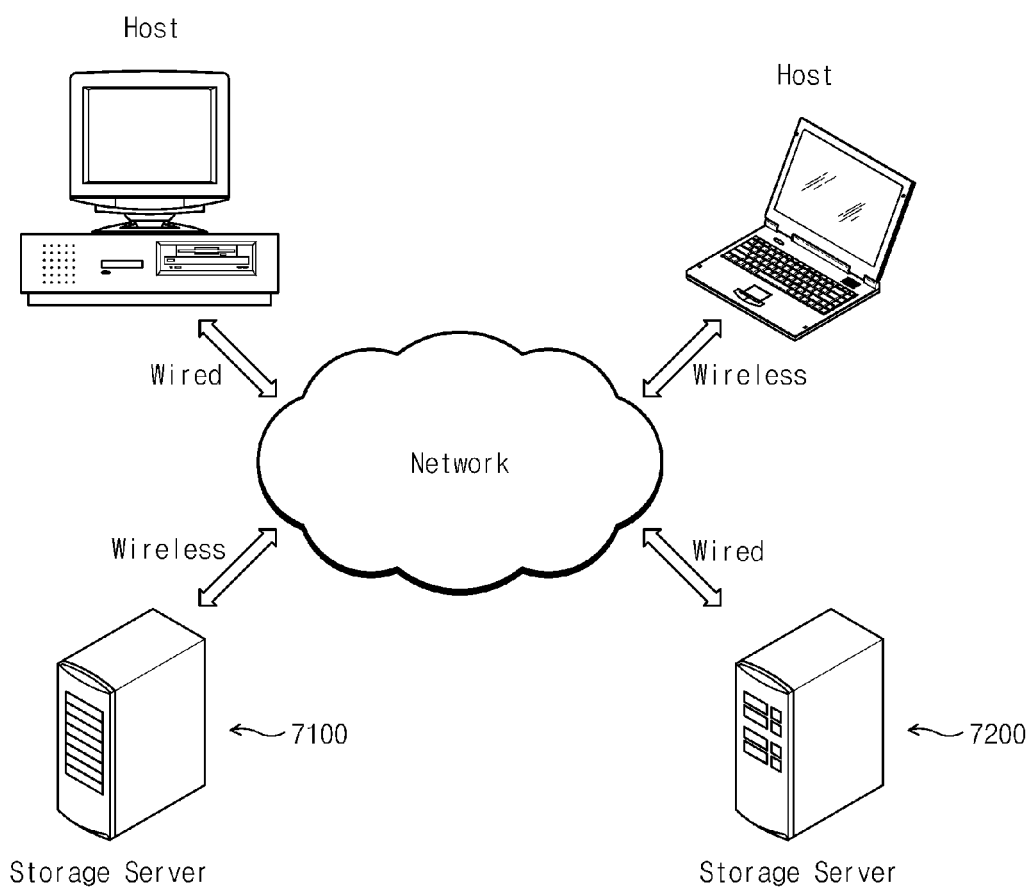
Figure 12:
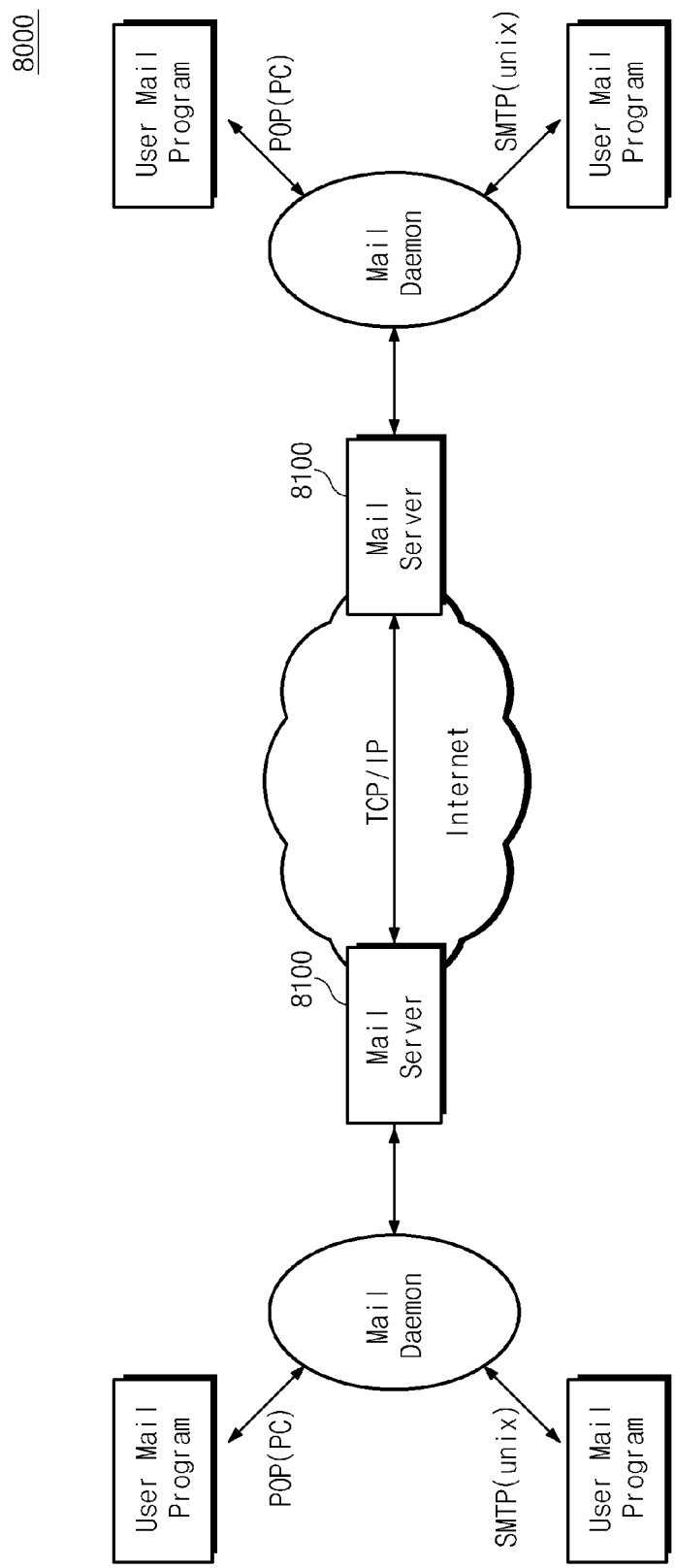

FIGS. 10 to 12 are diagrams schematically illustrating systems to which a data storage device according to an embodiment of the inventive concepts is applied.

In the event that a solid state drive including a data storage device according to an embodiment of the inventive concepts is applied to storage, as illustrated in FIG. 10, a system 6000 may include storage 6100 communicating with a host in a wire and/or wireless manner. In the event that a solid state drive including a data storage device according to an embodiment of the inventive concepts is applied to a storage server, as illustrated in FIG. 11, a system 7000 may include storage servers 7100 and 7200 communicating with a host in a wire and/or wireless manner. As illustrated in FIG. 12, a solid state drive including a data storage device according to an embodiment of the inventive concepts may be applied to a mail server 8100.

Figure 13:
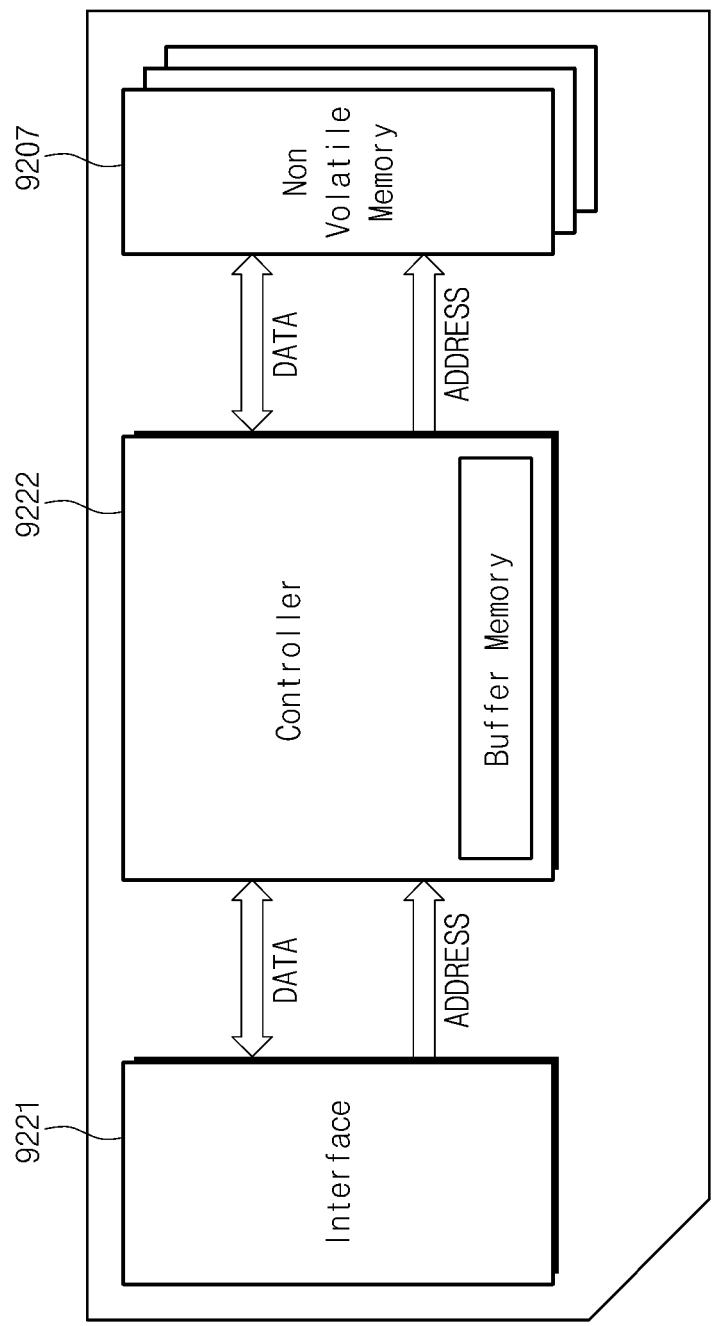
FIG. 13 is a block diagram illustrating a memory card according to an embodiment of the inventive concepts.

FIG. 13 is a block diagram illustrating a memory card according to an embodiment of the inventive concepts.

A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 13, the memory card may include an interface circuit 9221 for interfacing with an external device, a controller 9222 including a buffer memory and controlling an operation of the memory card, and at least one nonvolatile memory device 9207. The controller 9222 may be a processor which is configured to control write and read operations of the non-volatile memory device 9207. In particular, the controller 9222 may be coupled with the non-volatile memory device 9207 and the interface circuit 2221 via a data bus and an address bus. The controller 9222 and the non-volatile memory device 9207 may correspond to a memory controller 1200 and a nonvolatile memory device 1400 described in FIG. 1, respectively. That is, the controller 9222 may control the nonvolatile memory device 9207 such that a program time is varied according to an urgency level of a program operation. This may be accomplished using program command sequences including program speed information.

Figure 14:
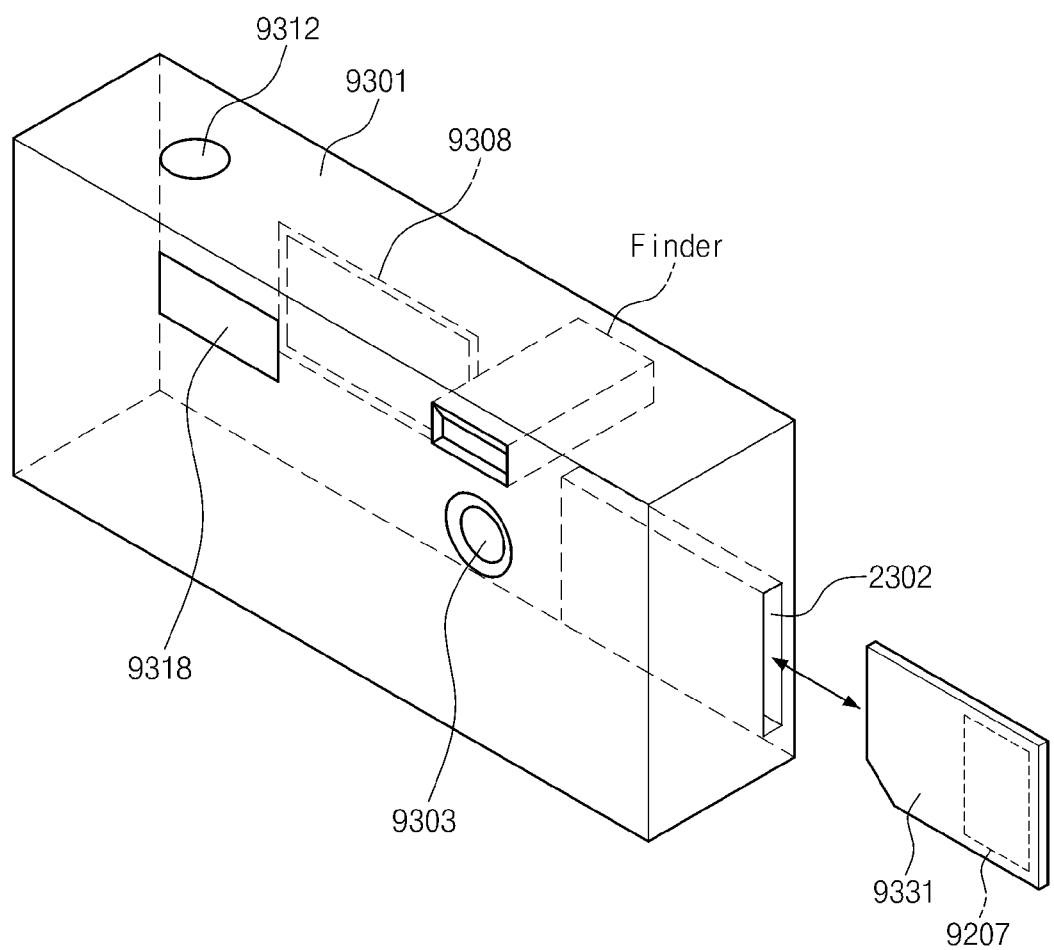
FIG. 14 is a block diagram illustrating a digital still camera according to an embodiment of the inventive concepts.

FIG. 14 is a block diagram illustrating a digital still camera according to an embodiment of the inventive concepts.

Referring to FIG. 14, a digital still camera may include a body 9301, a slot 2302, a lens 9303, a display circuit 9308, a shutter button 9312, a strobe 9318, and the like. In particular, a memory card 9331 is inserted in the slot 9308 and includes a memory controller and a nonvolatile memory device described in FIG. 1. That is, the memory controller may control the nonvolatile memory device such that a program time is varied according to an urgency level of a program operation. This may be accomplished using program command sequences including program speed information. For example, at a continuous photo shooting mode of a digital still camera a command sequence of a fast speed may be used to store more pictures. At a normal photo shooting mode, a command sequence of a normal speed may be used.

If the memory card 9331 has a contact type, an electric circuit on a circuit board is electrically contacted with the memory card 9331 when it is inserted in the slot 2302. In the event that the memory card 9331 has a non-contact type, an electric circuit on a circuit board communicates with the memory card 9331 in a radio-frequency manner.

Figure 15:
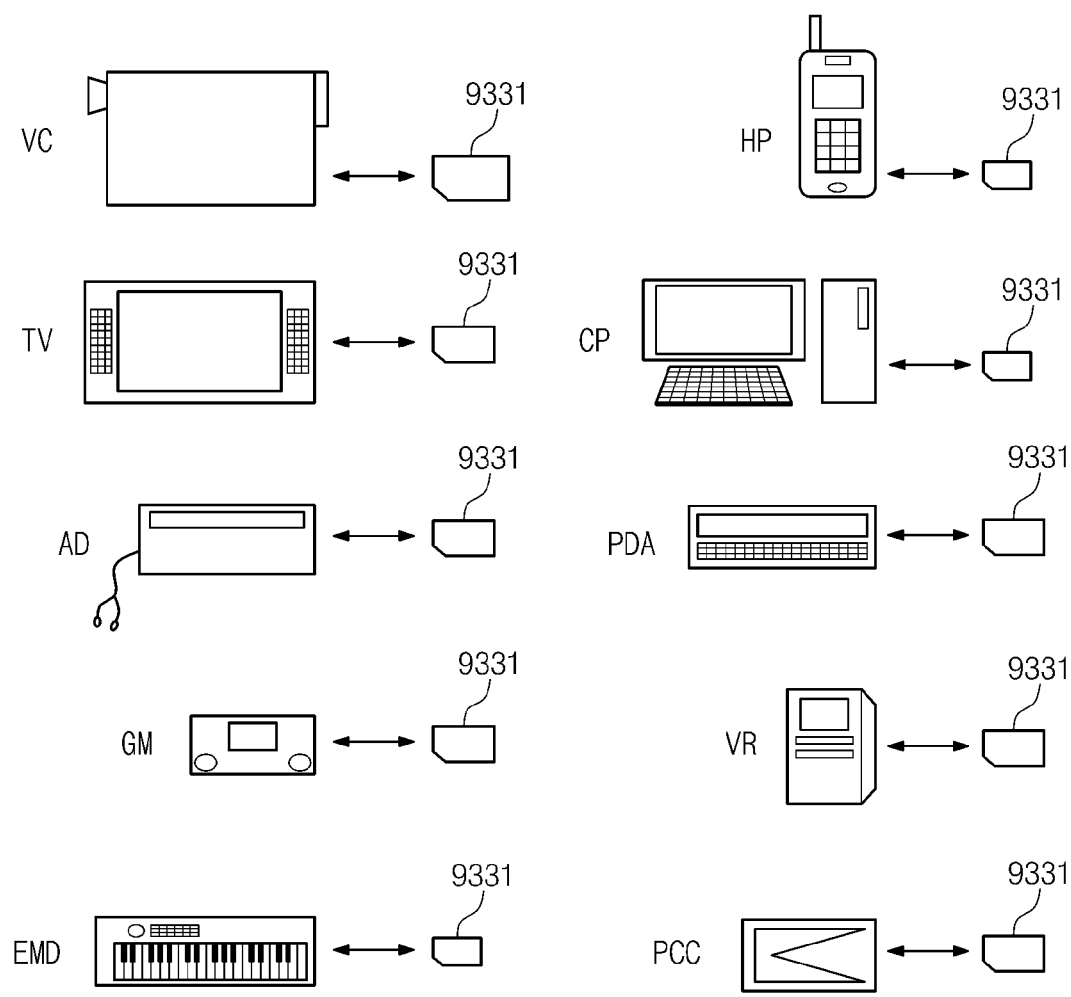
FIG. 15 is a diagram illustrating various systems to which a memory card in FIG. 14 is applied.

FIG. 15 is a diagram illustrating various systems to which a memory card in FIG. 14 is applied.

Referring to FIG. 15, a memory card 9331 may be applied to a video camera VC, a television TV, an audio device AD, a game machine GM, an electronic music device EMD, a cellular phone HP, a computer CP, a Personal Digital Assistant PDA, a voice recorder VR, a PC card PCC, and the like.

In an embodiment of the inventive concepts, memory cells can be formed of a variable resistance memory cell. An example variable resistance memory cell and a memory device including the same are disclosed in U.S. Pat. No. 7,529,124, the entirety of which is incorporated by reference herein.

In another embodiment of the inventive concepts, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc.

A memory device having a charge trap flash structure as a charge storage layer is disclosed in U.S. Pat. No. 6,858,906 and U.S. Publication Nos. 2004/0169238 and 2006/0180851, the entirety of which is incorporated by reference herein. A source-drain free flash structure is disclosed in KR Patent No. 673020, the entirety of which is incorporated by reference herein.

A nonvolatile memory device and/or a memory controller according to the inventive concepts may be packed using various types of packages. For example, A non-volatile memory device or a memory controller according to the inventive concepts may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A memory system comprising:
   a nonvolatile memory device configured to store data information; and
   a memory controller configured to control the nonvolatile memory device by providing the nonvolatile memory device with a program command sequence including program speed information according to an urgency level of an internally requested program operation.

2. The memory system of claim 1, wherein the internally requested program operation includes one of a background operation of the memory controller, an operation associated with a sudden power-off, and a garbage collection operation.

3. The memory system of claim 2, wherein a program time of the background operation is longer than a program time of an externally requested program operation.

4. The memory system of claim 2, wherein a program time of the operation associated with the sudden power-off is shorter than a program time of an externally requested program operation.

5. The memory system of claim 4, wherein the program command sequence includes a first command, an address, and a second command, and a value of the second command is decided according to whether a program operation is the exernally requested program operation or the internally requested program operation.

6. The memory system of claim 4, wherein data programmed via the operation associated with the sudden power-off is metadata.

7. The memory system of claim 6, wherein data programmed via the operation associated with the sudden power-off is reprogrammed based on the external requested program operation.

8. The memory system of claim 1, wherein the nonvolatile memory device comprises:
   a voltage generator configured to generate a program voltage; and
   a control logic configured to decide a start level of the program voltage or an increment of the program voltage based on the program speed information included in the program command sequence.

9. The memory system of claim 1, wherein the memory controller and the nonvolatile memory device together form part of one of a memory card and a solid state drive.

10. An operating method of a memory system which includes a nonvolatile memory device and a memory controller, the operating method comprising:
    judging whether a program operation is an internally requested program operation requested within the memory controller or an externally requested program operation requested from a device external to the memory controller; and
    providing the nonvolatile memory device with a program command sequence including information of a program speed that varies according to an urgency level of the requested program operation, based on the judgment result.

11. The operating method of claim 10, wherein the internally requested program operation includes one of a background operation of the memory controller, an operation associated with sudden power-off, and a garbage collection operation.

12. The operating method of claim 11, wherein a program time of the background operation is longer than a program time of the externally requested program operation.

13. The operating method of claim 12, wherein a program time of the operation associated with the sudden power-off is shorter than a program time of the externally requested program operation.

14. The operating method of claim 13, wherein the program command sequence includes a first command, an address, and a second command, and a value of the second command is decided according to whether the program operation is the exernally requested program operation or the internally requested program operation.

15. The operating method of claim 10, wherein the program speed is varied by controlling a start level or an increment of a program voltage based on program speed information included in the program command sequence.

16. A memory system comprising:
    a nonvolatile memory device configured to program write data into memory cells at a program speed; and
    a memory controller configured to transmit a program command sequence to the nonvolatile memory device, the program command sequence varying the program speed according to whether a program operation is an internally requested program operation requested within the memory controller or an external requested program operation requested from a device external to the memory controller.

17. The memory system of claim 16, wherein the program speed varies directly with an urgency level of the program operation, if the program operation is the internally requested program operation.

18. The memory system of claim 17, wherein
    the internally requested program operation includes one of a background operation of the memory controller, an operation associated with sudden power-off, and a garbage collection,
    the urgency level of the background operation is less than the urgency level of the external requested program operation, and
    the urgency level of the operation associated with sudden power-off is greater than the urgency level of the externally requested program.

19. The memory system of claim 16, wherein the nonvolatile memory device comprises:
    a voltage generator configured to generate a program voltage that determines the program speed; and a control circuit configured to control the program voltage in accordance with the program command sequence provided by the memory controller.

20. The memory system of claim 19, wherein the program speed is varied by a start level or an increment of the program voltage.

* * * * *